United States Patent [19]

Abrahamsen

[11] 4,016,357
[45] Apr. 5, 1977

[54] FLOOR STRUCTURE FOR THE ENVIRONMENT OF A MODULAR COMPUTER SYSTEM

[75] Inventor: Thomas C. Abrahamsen, Birmingham, Mich.

[73] Assignee: Burroughs Corporation, Detroit, Mich.

[22] Filed: July 18, 1975

[21] Appl. No.: 597,019

[52] U.S. Cl. .................................. 174/48; 52/126; 52/263; 248/19; 248/346; 174/35 R

[51] Int. Cl.² .................. H05K 9/00; E04F 15/024

[58] Field of Search .................. 248/19, 346, 23; 52/518, 126, 263, 173; 174/35 R, 48

[56] References Cited

UNITED STATES PATENTS

| | | | |
|---|---|---|---|
| 684,201 | 10/1901 | Dick | 248/19 |
| 3,066,898 | 12/1962 | Haynes | 248/23 |
| 3,190,041 | 6/1965 | Kimball | 248/19 |
| 3,493,201 | 2/1970 | Marran | 248/19 |
| 3,817,015 | 6/1974 | Frangos | 52/273 |
| 3,862,350 | 1/1975 | Milosavich | 174/35 R |

FOREIGN PATENTS OR APPLICATIONS 440,961  7/1935  United Kingdom ........... 52/518

Primary Examiner—Price C. Faw, Jr.
Assistant Examiner—James L. Ridgill, Jr.
Attorney, Agent, or Firm—Carl Fissell, Jr.; Edwin W. Uren; Kevin R. Peterson

[57] ABSTRACT

A modular and readily arrangeable raised floor structure for computer system sites is provided wherein the weight of the hardware units is supported by raised support members of rigid construction integrally formed with the hardware units and disposed on the permanent flooring in the site area, and the area between and surrounding the hardware units is rendered conveniently accessible to human attendants by modular raised floor panels of less rigid construction abuttably arranged relative to one another and to the raised support members of the hardware units, said raised support members integrally formed with the hardware units and said abuttably arranged raised floor panels serving to accommodate hidden interconnections of various types between the hardware units and to facilitate coupling of the system with external power and cooling sources.

3 Claims, 6 Drawing Figures

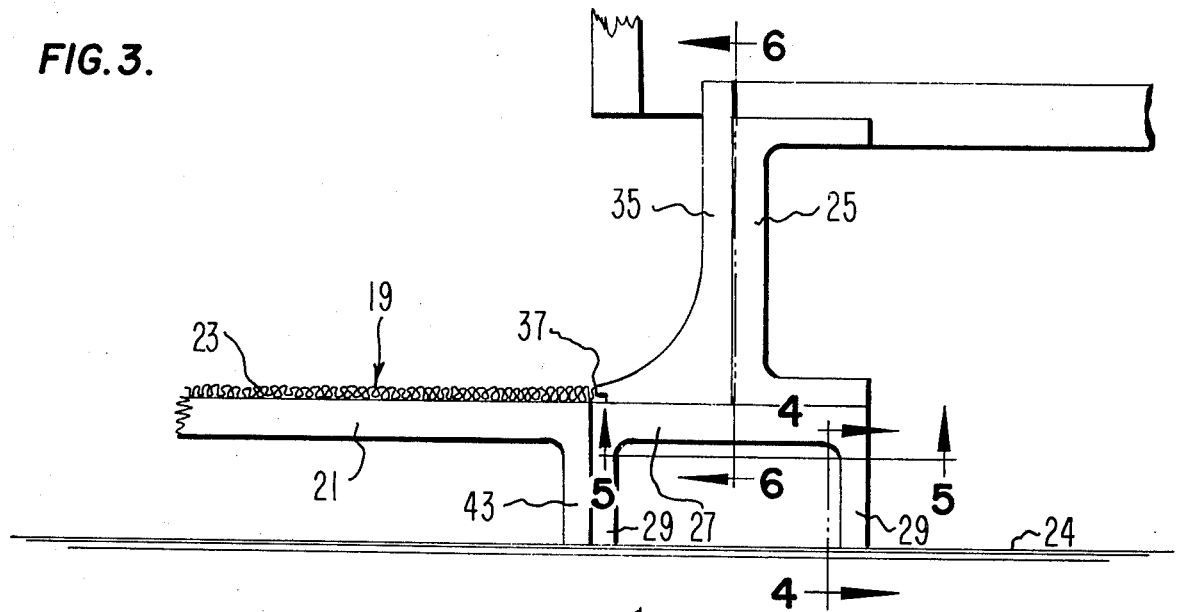
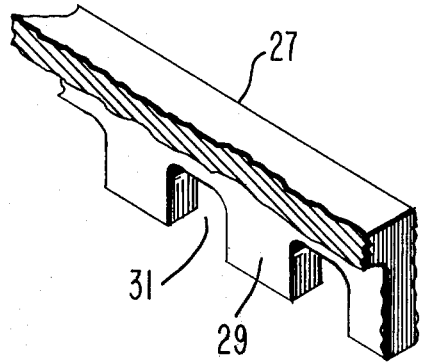
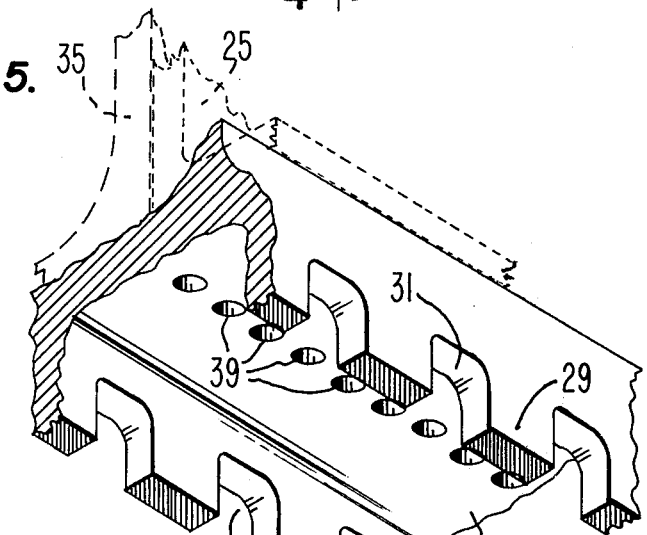
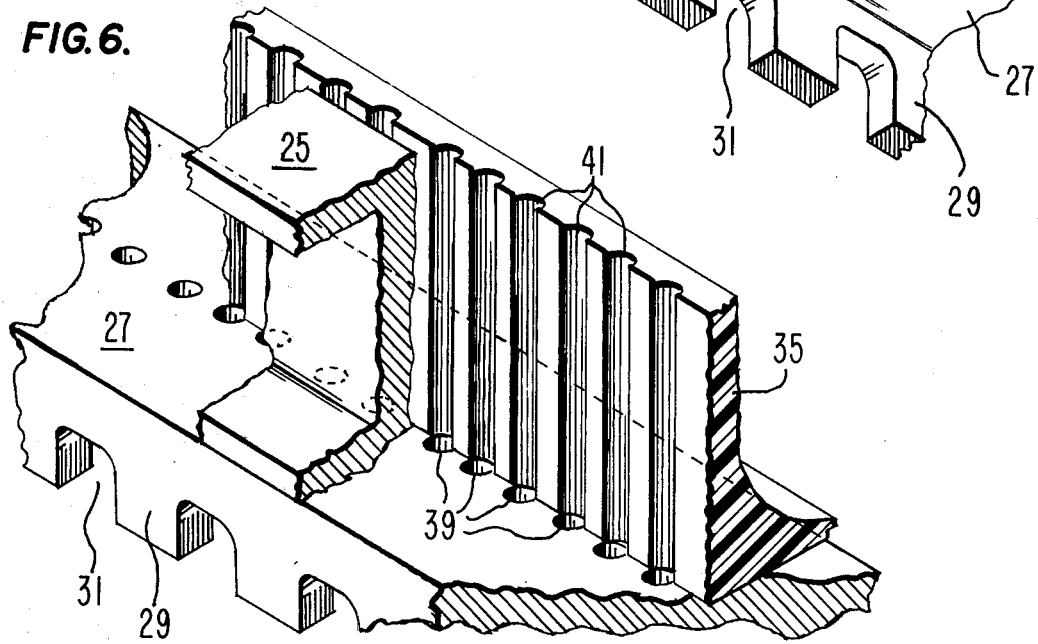

FLOOR STRUCTURE FOR THE ENVIRONMENT OF A MODULAR COMPUTER SYSTEM

BACKGROUND OF THE INVENTION

Known computer systems have typically been comprised of a central processor having internal and external memory storage and a plurality of input and output peripherals such as card and tape readers, keyboards, printers, punches, display panels, etc., the central processor and peripherals being arranged in the site area in predetermined configuration and interconnected by cables, pipes, air ducts, and the like for the purpose of powering and coordinating the various units and maintaining each unit at its required operating temperature. To accommodate the required interconnections between the various hardware units of the computer system, and to effectuate the routing of such interconnections away from the traffic patterns that might be used by persons responsible for attending the system, computer site areas have generally been provided with raised flooring structures disposed a predetermined distance above the permanent flooring, the space between the raised and permanent floorings being utilized for channeling and routing the various required interconnections.

As a consequence of the practice of providing computer sites with raised flooring, a variety of elevated flooring structures have been developed and disclosed in the prior art, including adjustable elevating supports or pedestals, variously formed and dimensioned surface panels, and a variety of grid-like super-structures for positioning the surface panels relative to the pedestals. As an example of the structures provided by the prior art, U.S. Pat. Nos. 3,681,882 and 3,811,237 to Bettinger teach the use of edge-carpeted rectangular panels adhesively supported by grid-like metallic stringers that are positioned a predetermined distance above the permanent flooring by a plurality of equally spaced apart adjustable metallic pedestals, the edge-carpeting of the panels serving to seal the space between adjoining panels against air leakage and to reduce the criticality of slight variations in the size and configuration of the panels themselves. As a further example of the raised flooring structures provided by the prior art, U.S. Pat. No. 3,852,928 to Raith teaches the use of non-adjustable elevating supports fixed to the corners of each of a plurality of rectangular panels, the panels being diagonally split and hinged to thereby provide a self-adjusting characteristic to each individual panel, the sum total of the panels being carpeted to hold the panels to inter-abutting relationship.

A hereinafter described characteristic of known elevated flooring structures has evolved from the practice of placing the various hardware units comprising a computer system in appropriate interrelationship on top of the elevated flooring structure, and of thereafter channeling and routing the electrical and cooling interconnections between the units in the space between the elevated flooring and the permanent flooring. Since, to be viable, a raised flooring structure for a computer system must lend itself to subsequent modification and upgrading as peripherals are substituted and added, it has been deemed advisable to build flooring structures of the type disclosed in the prior art of uniform strength and rigidity throughout the site area, and thus to provide such known structures with the trait of being sufficiently strong to support the weight of the hardware units, and of greater strength and rigidity than would be required to serve as a platform for those having responsibility for attending the system. This common trait of known raised flooring structures highlights two significant disadvantages that tend to characterize all such known structures, namely the excessive cost that is incurred in their initial manufacture and installation, and the difficulty and expense that is encountered in system upgrading when it becomes necessary to relocate the hardware units on the raised flooring structure, and to thereafter remove the remaining panels of the structure for the purpose of re-routing and re-channeling the electrical and cooling interconnections in the space between the raised flooring and the permanent flooring.

Whereas contemplated changes in the design and architecture of future generation computer systems are likely to have an ancillary effect on the nature and extent of the interconnections between the hardware units, by reason of such innovations as denser packaging and modified cooling techniques, the increased peripheral capacity of such systems is expected to accentuate rather than to diminish the need of elevated flooring structures, if for no other reason than to accommodate the channeling and routing of the increased number of cable interconnections that will be required by the increased peripheral capacity. Future innovations in computer design are accordngly expected to further highlight the need of inexpensive and readily re-arrangeable raised flooring structures for use in computer site areas.

SUMMARY OF THE INVENTION

It is accordingly an object of the present invention to provide a modular raised flooring structure for use in computer site areas that is relativeliy inexpensive to manufacture and to install, and wherein economy is realized by varying the strength and rigidity of the structure as between the areas supporting the weight of the hardware units and the areas serving merely as a platform for those responsible for attending the system.

It is a further object of the present invention to provide a raised flooring structure for computer site areas that is readily re-arrangeable and conveniently adaptable to system upgrading and modification as hardware units are substituted and/or added, and wherein such adaptability is achieved without deviating from the principle of providing strength and rigidity according to the weight that is to be supported in the various site areas.

An important aspect of the present invention is the provision of sturdy elevated support members for supporting the weight of the hardware units, and the provision of economical modular elevated floor panels for filling the space between and surrounding the hardware units. The sturdy support members are integrally formed with the base members of the hardware units and provide a predetermined elevation thereof from the permanent flooring, and the economical modular floor panels are elevated a predetermined equal distance from the permanent flooring to thereby accommodate the electrical and cooling interconnections between the units, the arrangement being such that the hardware units and interconnections thereof may be placed and positioned on the permanent flooring, and the modular panels thereafter positioned in abutting relationship relative to one another and to the sturdy support members without significantly re-routing or re-channeling the interconnections.

BRIEF DESCRIPTION OF THE DRAWING

These and other objects, advantages and features of the invention will become more readily apparent from the following description when read in conjunction with the following drawing figures, in which:

FIG. 3 is a cross-sectional view of the inventive raised flooring structure showing various details of a rigid support member for supporting the weight of a hardware unit and of modular raised floor panel abuttably disposed relative thereto;

FIG. 4 is a view taken along the line 4—4 of FIG. 3 and showing a plurality of slots formed in the vertical section of a rigid support member through which inteconnecting cables and the like may be channeled into the interior of a hardware unit;

FIG. 5 is a view taken along the line 5—5 of FIG. 3 and showing a plurality of apertures formed in the horizontal section of the rigid support member through which interconnecting cables and the like may be channeled into the interior of a hardware unit; and FIG. 6 is a view taken along the line 6—6 of FIG. 3 and showing a plurality of semi-cylindrical grooves formed in the inboard surface of the interface between the elements comprising a rigid support member, said grooves permitting entry of interconnecting cables and the like into the interior of a hardware unit when fed through the apertures shown in FIG. 5.

DESCRIPTION OF THE PREFERRED EMBODIMENT

Figure 1:
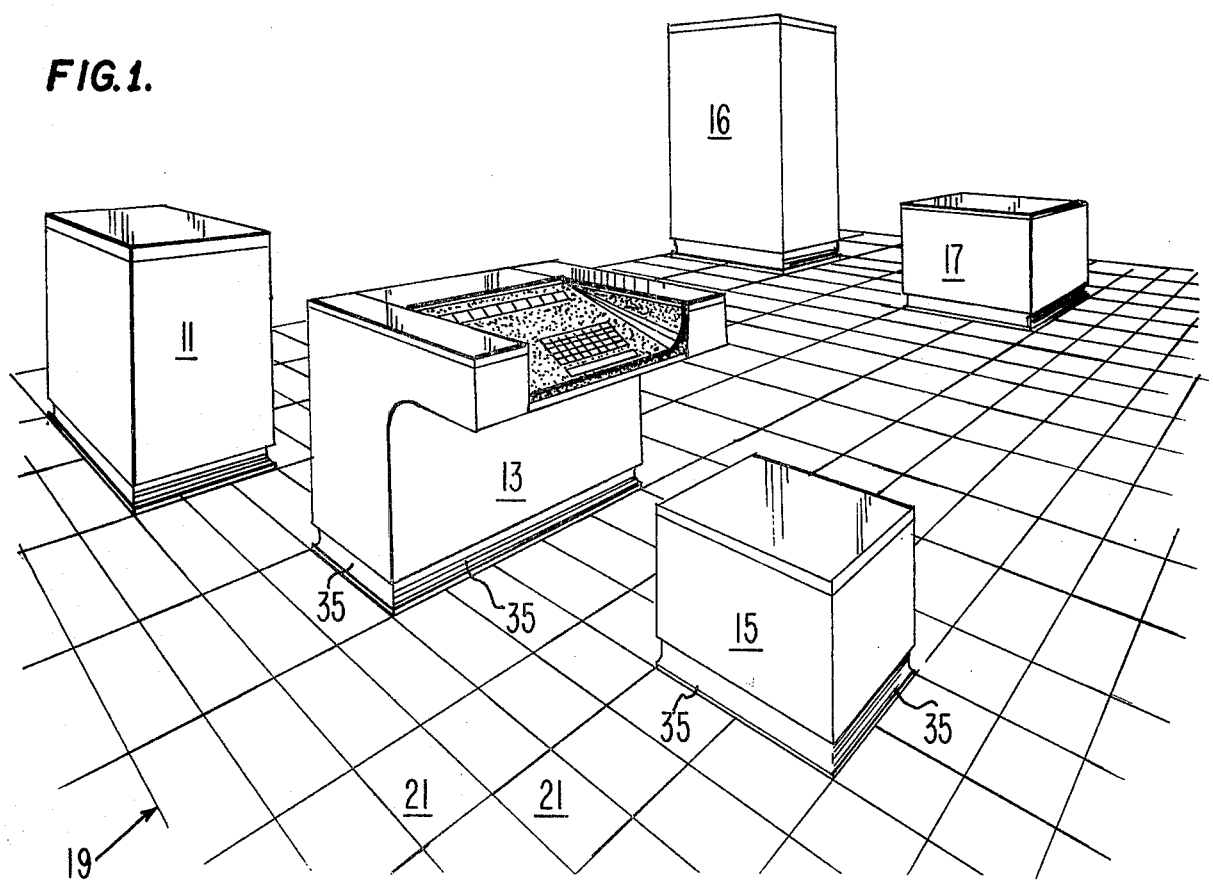
FIG. 1 is a perspective view of a portion of a computer site area showing a number of hardware units of a computer system disposed on a raised flooring structure.

As indicated supra under Background of the Invention, a typical computer installation may be comprised of a central processor and a plurality of input and output peripherals such as keyboards, card and tape readers, line printers and card punches. The interconnections between the various hardware units of the computer system are generally hidden from view and displaced from the traffic patterns utilized by those having responsibility for attending the system by means of a raised flooring structure that serves as a platform in the area intermediate and surrounding the hardware units, the electrical cables and cooling interconnections being disposed intermediate the raised flooring structure and the permanent flooring in the site area. FIG. 1 is illustrative of a computer site area wherein hardware units 11, 13, 15, 16 and 17 are arranged in predetermined configuration relative to a platform 19 that surrounds the hardware units, the interconnections between the hardware units being hidden from view and disposed intermediate the platform 19 and the permanent flooring 24 (FIG. 3). It can be seen from FIG. 1 that the platform 19 is comprised of a plurality of substantially square raised panels 21 which are abuttably disposed relative to one another and to the hardware units, strips of carpeting 23 (FIG. 3) being utilized to hold the panels 21 or third elevated support members in such abuttable relationship.

Whereas the raised flooring structure represented by the platform 19 in FIG. 1 and utilized in prior art computer site areas has typically been constructed of uniform strength and rigidity, and of a rigidity sufficient for supporting the weight of the hardware units at any point along the surface of the platform, the inventive raised flooring structure provides rigid means for supporting the weight of the hardware units themselves, and less rigid means in the area of the platform 19 for supporting humans charged with the responsibility of attending the computer system.

Figure 2:
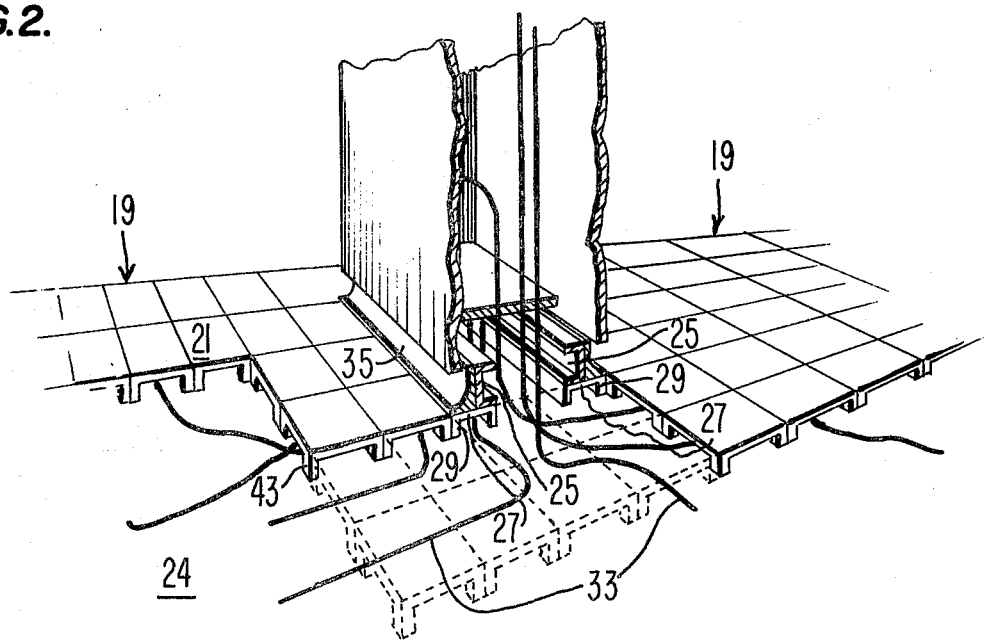
FIG. 2 is a perspective view of a portion of one of the hardware units and of the raised flooring structure associated therewith, individual modules of the raised flooring structure being removed to reveal the understructure thereof and the typical channeling and routing of the interconnections into the interior of the hardware unit.

As best illustrated in FIGS. 2 and 3, each of the hardware unit 11, 13, 15, 16 and 17 is supported on the permanent flooring 24 by four vertically oriented second elevated support members or channel beams 25 forming the base of the hardware unit, and four horizontally oriented channel beams 27 fixed to the lower flange of the beams 25, offset extensions 29 of the horizontally oriented channel beams 27 or first elevated support members to support the hardware unit on the permanent flooring 24 and to dispose the unit a predetermined distance above the permanent flooring and flush with the platform 19. The offset extensions 29 of the horizontally oriented channel beams 27 may be provided with vertically oriented slots 31 as illustrated in FIG. 4, such slots serving to accommodate the interconnections 33 between the hardware units, as illustrated in FIG. 2. The rigid means for supporting the weight of the hardware units, in the form of the vertically and horizontally oriented channel beams 25 and 27, may be constructed of cold rolled steel, or of a sturdy plastic material that is adequate for supporting the weight of the particular hardware unit. As illustrated in FIGS. 1, 2 and 3, the outboard exposed surfaces of the vertically and horizontally oriented channel beams 25 and 27 may be covered with a readily installable plastic interface member 35 which may be retained in place by retaining strips 37 as a means retaining said members in abuttable relationship relative to one another disposed along the outer edges of the horizontally oriented channel beams 27, as best illustrated in FIG. 3. As best illustrated in FIGS. 5 and 6, the horizontally oriented channel beams 27, in addition to the vertically oriented slots 31, may be provided with a plurality of apertures 39 formed in the horizontal surfaces thereof, and the interface members 35 may be provided with a plurality of semi-cylindrical grooves 41, such apertures and grooves additionally serving to accommodate the routing of the interconnections 33 into the corresponding hardware units.

The less rigid means provided by the inventive modular raised flooring structure is comprised of a plurality of substantially square raised panels 21 which make up the platform 19. Each of the panels 21 is provided with four corner legs or elevated supports 43 which serve to hold the panel in spaced relationship relative to the permanent flooring 24 and to define the height of the platform 19. The modular panels 21 may be made of a molded plastic material having integrally formed elevated supports 43, or the horizontal surface area of the panels may be made of wood with wooden elevated supports 43 mechanically or adhesively fixed thereto. The elevated supports 43 of the raised panels 21 and the offset extensions 29 of the beams 27 may be of any suitable height to dispose the platform 19 and the hardware units an appropriate spaced distance above the permanent flooring 24, such spaced distance being required for the accommodation of the interconnections 33 intermediate the hardware units and beneath the platform 19. A 3-inches spaced distance between the platform 19 and the permanent flooring 24 may, for example, prove adequate. The modular panels 21 may also be made in any desired size, such as in 15 inches squares or 12 inches squares. The individual panels 21 of the modular platform 19 may also be covered with an appropriate carpeting material, such as is illustrated in FIG. 3, or with a vinyl floor covering, and the selected covering may be applied individually to each panel or collectively to encompass the total area of the platform 19. It is to be noted, however, as mentioned supra, that the collective application of the carpeting material to the panels 21 would serve to hold the panels in secure abuttable relationship relative to one another and to the rigid support means of the various hardware units.

It can thus be seen that by providing rigid raised support means for supporting the hardware units on the permanent flooring 24 and by providing less rigid modular support means for supporting the weight of humans charged with the responsibility of attending the computer system, an elevated flooring structure of distinctive characteristics is made available, such distinguishing characteristics providing the two-fold advantages of maximized economy in construction and installation, and maximized convenience in the re-arrangement of the computer site area to accommodate the modification and upgrading of the computer system. To highlight the simplicity with which the inventive elevated flooring structure may be installed, and the convenience with which the raised flooring structure may be re-arranged to accommodate the substitution and addition of units, corresponding methods for accomplishing these tasks are hereinafter set forth.

The following steps are involved in initially installating the raised flooring structure in the computer site area:

1. Attaching four horizontally oriented channel beams 27 to the four vertically oriented channel beams 25 comprising the base of each hardware unit;
2. Arranging the hardware units in proper relationship to one another on the permanent flooring 24;
3. Channeling and routing the interconnections 33 between the hardware units and making the necessary connections with external power and cooling sources, the interconnections 33 being appropriately fed through the vertically oriented slots 31 and apertures 39 formed in the beams 27, and disposed on the permanent flooring 24;
4. Fastening four interface members 35 to the exposed areas of the channel beams 25 and 27 of each hardware unit, being certain that the interconnections fed through the apertures 39 are properly disposed within the semi-cylindrical grooves 41 thereof, and certain also that each interface member 35 is positionably secured by its corresponding retaining strip 37;
5. Filling the space between the hardware units with a plurality of raised panels 21, such that a modular platform 19 is formed throughout the length and width of the computer site area; and
6. Covering the raised panels 21 with a floor covering material effective for holding the panels in secure abutting relationship with one another and with the beams 27 of the rigid support means.

The following steps are involved in re-arranging the computer site area to accommodate the substitution and/or addition of hardware units;

1. Removing the floor covering 23 from the raised panels 21 in the area affected by the substitution and/or addition;
2. Removing the raised panels 21 from the approximate area in which the substitution and/or addition is to be made;
3. Removing the unit for which a substitution is to be made, and positioning the substituted or added unit in the computer site area in appropriate relationship relative to the remaining units of the system, and with the horizontally oriented channel beams 27 thereof disposed in contact with the permanent flooring 24;
4. Interconnecting the added unit with the remaining units of the computer system, with the interconnections 33 thereof disposed on the permanent flooring 24;
5. Fastening four interface members 35 to the exposed areas of the channel beams 25 and 27 of the added unit, making certain that the interconnections fed through the apertures 39 of the added unit are properly disposed within the semi-cylindrical grooves 41 thereof, and certain also that each interface member 35 is positionably secured to its corresponding retaining strip 37;
6. Filling in the modular platform 19 by replacing the raised panels 21 in abutting relationship relative to one another and to the horizontally oriented channel beams 27; and
7. Recovering the replaced raised panels 21 with the floor covering material such that the replaced panels are secureably held in abutting relationship relative to one another.

Although a preferred embodiment of the inventive elevated floor structure has been described in considerable detail, it will be appreciated that various changes and modifications therein may be made by those having ordinary skill in the art without departing from the true spirit and scope of the invention, it being intended that such spirit and scope be limited only by the appended claims.

What is claimed is:

1. A site area for a computer system wherein the interconnections between the hardware units may be removed from view and displaced from the access pathways utilized by humans in attending the computer system and wherein the hardware units may be added to or substituted within the system with minimal inconvenience and disruption comprising:
    a. a plurality of first elevated support members providing a base for each of the hardware units;
    b. a plurality of second elevated support members secured to the first elevated support members of each hardware unit;
    c. a permanent flooring in the site area;
    d. the hardware units being disposed on the permanent flooring in proper relationship to one another so that the second elevated support members thereof are contactably supported by said permanent flooring;

e. means interconnecting the hardware units with the required cables and the like so that the interconnections are disposed on and along the permanent flooring;

f. a plurality of rectangularly shaped modular third elevated support members arranged in the site area intermediate and surrounding the hardware units and in abutting relationship with one another and with the first elevated support members, the arrangement of the modular third elevated support members being accompanied by slight displacements of the interconnections such that the third elevated support members straddle the interconnections; and g. means retaining said members in said abuttable relationship relative to one another and with said second elevated support member.

2. A site area for a computer system wherein the interconnections between the hardware units may be removed from view and displaced from the access pathways utilized by humans in attending the computer system and wherein the hardware units may be added to or substituted within the system with minimal inconvenience and disruption comprising:

a. a plurality of first vertically elevated channel beams providing a base for each of the hardware units;

b. a plurality of second horizontally elevated channel beams secured to the first elevated channel beams of each hardware unit;

c. a permanent flooring in the site area;

d. the hardware units being disposed on the permanent flooring in proper relationship to one another so that the second plurality of elevated channel beams are contactably supported by said permanent flooring;

e. means interconnecting the hardware units with the required cables and the like so that the interconnections are channeled and routed on and along the permanent flooring;

f. a plurality of rectangularly shaped modular third elevated channel beams arranged in the site area intermediate and surrounding the hardware units and in abutting relationship with one another and with the first plurality of elevated channel beams, the arrangement of the modular third elevated channel beams being accompanied by slight displacements of the interconnections such that the third plurality of elevated channel beams straddle the interconnections; and g. retaining strips for attaching said beams in said abuttable relationship relative to one another.

3. A site area for a computer as defined in claim 2 wherein said plurality of second elevated channel beams further includes a plurality of apertures therein, interface members having a plurality of semi-cylindrical grooves therein, said interface members being secured to said channel beams so that said grooves and said apertures are concentric permitting the cabling to be received therethrough without obstruction.

* * * * *